United States Patent
Yoshimura et al.

(10) Patent No.: US 11,494,536 B2
(45) Date of Patent: Nov. 8, 2022

(54) FLIGHT CONTROL DEVICE FOR AIRCRAFT

(71) Applicant: SUBARU CORPORATION, Tokyo (JP)

(72) Inventors: Kensuke Yoshimura, Tokyo (JP); Masakatsu Abe, Tokyo (JP); Takuya Nakano, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 420 days.

(21) Appl. No.: 16/688,834

(22) Filed: Nov. 19, 2019

(65) Prior Publication Data

US 2020/0192991 A1 Jun. 18, 2020

(30) Foreign Application Priority Data

Dec. 18, 2018 (JP) .............................. JP2018-236182

(51) Int. Cl.
  *G01M 5/00* (2006.01)
  *G01L 5/16* (2020.01)
  *G06F 30/23* (2020.01)
  *G06F 30/15* (2020.01)

(52) U.S. Cl.
  CPC ............ *G06F 30/23* (2020.01); *G01M 5/0016* (2013.01); *G06F 30/15* (2020.01); *G01L 5/16* (2013.01)

(58) Field of Classification Search
  None
  See application file for complete search history.

(56) References Cited

U.S. PATENT DOCUMENTS

| | | | |
|---|---|---|---|
| 2010/0222993 A1 | 9/2010 | Brainard et al. | |
| 2014/0168219 A1* | 6/2014 | Das | G06F 30/23 |
| | | | 345/420 |
| 2018/0362190 A1* | 12/2018 | Chambers | B64D 45/00 |

FOREIGN PATENT DOCUMENTS

JP 2013-109443 A 6/2013

OTHER PUBLICATIONS

Extended European Search Report dated May 19, 2020 for European Patent Application No. 19214474.9-1001.

* cited by examiner

*Primary Examiner* — Brent A. Fairbanks
(74) *Attorney, Agent, or Firm* — McGinn I.P. Law Group, PLLC.

(57) ABSTRACT

A load calculator includes a coefficient storage, a replacement deriver, and an internal-load deriver. The storage stores a first coefficient, an internal load acting on a target point in a target member when a unit load acts on a concentrated load point in the target member along one of three orthogonal axes, and as a second coefficient, an internal load acting on the target point when a unit moment acts on the concentrated load point around one of the axes. The replacement deriver derives a replacement load and moment by replacing an external load acting on the target member with six force components acting on the concentrated load point. The internal load deriver derives an internal load acting on any target point with the first coefficient, the replacement load, the second coefficient, and the replacement moment when the external load acts on the target member.

14 Claims, 6 Drawing Sheets

FLIGHT CONTROL DEVICE FOR AIRCRAFT

CROSS-REFERENCE TO RELATED APPLICATIONS

The present application claims priority from Japanese Patent Application No. 2018-236182 filed on Dec. 18, 2018, the entire contents of which are hereby incorporated by reference.

BACKGROUND

The disclosure relates to load calculators that calculate loads, and to aircrafts.

The finite element method is sometimes used for analyzing the strength of components constituting an aircraft (e.g., see Japanese Unexamined Patent Application Publication No. 2013-109443).

SUMMARY

An aspect of the disclosure provides a load calculator including a coefficient storage unit, a replacement deriving unit, and an internal-load deriving unit. The coefficient storage unit is configured to store, as a first coefficient associated with a concentrated load point in a target member and a target point in the target member, an internal load acting on the target point when a unit load acts on the concentrated load point in an axial direction corresponding to one of three orthogonal axes, and to store, as a second coefficient associated with the concentrated load point and the target point, an internal load acting on the target point when a unit moment acts on the concentrated load point around one of the three axes. The replacement deriving unit is configured to derive a replacement load and a replacement moment by replacing an external load acting on the target member with six force components acting on the concentrated load point. The internal-load deriving unit is configured to derive an internal load acting on any target point as a sum of a product of the first coefficient and the replacement load and a product of the second coefficient and the replacement moment when the external load acts on the target member.

An aspect of the disclosure provides a load calculator including a coefficient storage unit and an upper-limit deriving unit. The coefficient storage unit is configured to store, as a first coefficient associated with a concentrated load point in a target member and a target point in the target member, an internal load acting on the target point when a unit load acts on the concentrated load point in an axial direction corresponding to one of three orthogonal axes, and to store, as a second coefficient associated with the concentrated load point and the target point, an internal load acting on the target point when a unit moment acts on the concentrated load point around one of the three axes. The upper-limit deriving unit is configured to derive an upper limit value for an external load acting on the concentrated load point associated with the target point from an upper limit value for the internal load acting on the target point and the first coefficient and the second coefficient associated with the target point.

An aspect of the disclosure provides an aircraft including a flight controller and one of the load calculators. The flight controller is configured to perform flight control in such a manner that the internal load does not exceed a set upper limit value.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

In the following, an embodiment of the technology is described in detail with reference to the accompanying drawings. Note that the following description is directed to an illustrative example of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiment which are not recited in a most-generic independent claim of the technology are optional and may be provided on an as-needed basis. The drawings are schematic and are not intended to be drawn to scale. Throughout the present specification and the drawings, elements having substantially the same function and configuration are denoted with the same numerals to avoid any redundant description.

In addition to the aircraft mentioned above, an analysis technique is sometimes used to derive an internal load of a target member occurring in response to an external load. Moreover, an upper limit value for the external load of the target member is sometimes derived from an upper limit value for the internal load. In either case, since the calculation load is high, it is desirable to develop a technology for reducing the load for calculating these loads.

It is desirable to provide a load calculator and an aircraft that can reduce the load for calculating loads.

Figure 1:
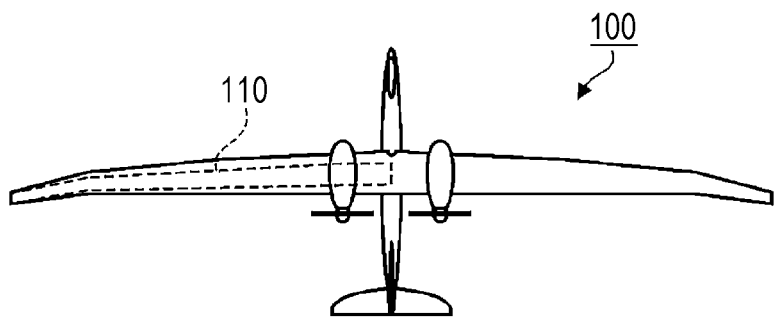
FIG. 1 schematically illustrates an aircraft.

FIG. 1 schematically illustrates an aircraft 100. The following description relates to an example where a component partially constituting a main wing of the aircraft 100 is a target member 110. Alternatively, the target member 110 may be a component constituting a part other than the main wing of the aircraft 100 or may be a component constituting an object other than the aircraft 100.

Figure 2:
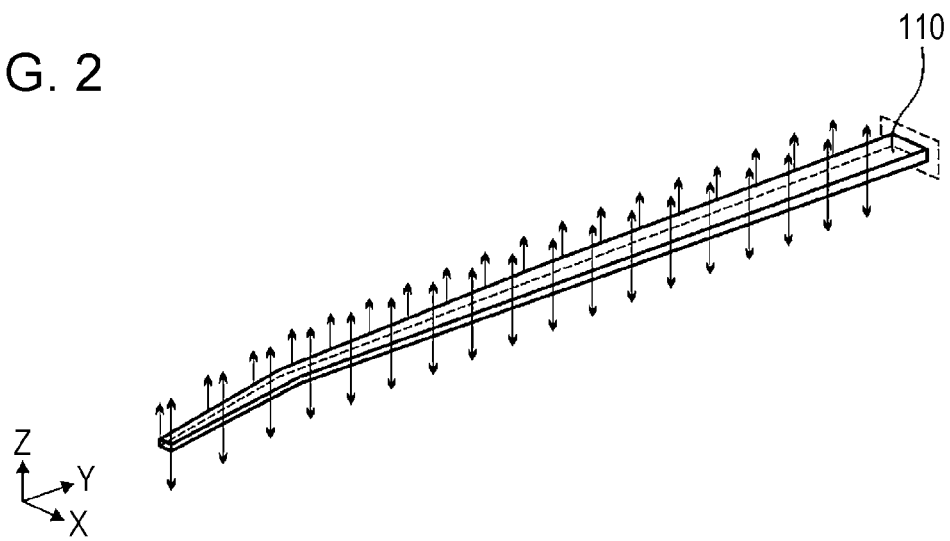
FIG. 2 is a perspective view of a target member.

FIG. 2 is a perspective view of the target member 110. The target member 110 (i.e., main wing) has a so-called box structure. The directions of X, Y, and Z axes that are orthogonal to one another are defined with respect to the target member 110 as illustrated in FIG. 2. For example, the X axis is defined as the front-rear direction of the aircraft 100, the Y axis is defined as the longitudinal direction of the target member 110, and the Z axis is defined as the height direction of the aircraft 100. As illustrated in FIG. 2, for example, distributed loads act on the target member 110 in the Z-axis direction.

Figure 3:
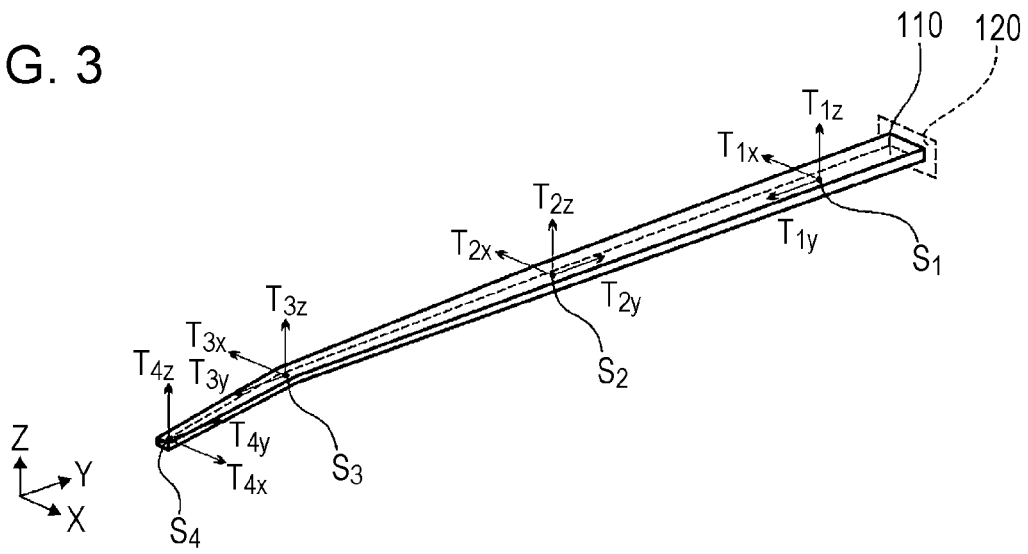
FIG. 3 illustrates replacement loads.
Figure 4:
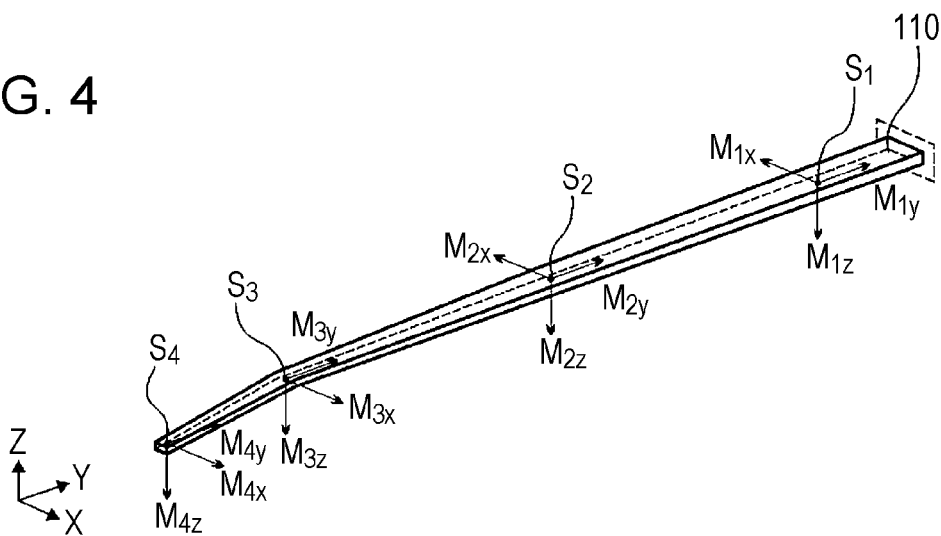
FIG. 4 illustrates replacement moments.

FIG. 3 illustrates replacement loads after a replacement process. FIG. 4 illustrates replacement moments after a replacement process. As illustrated in FIG. 3, a plurality of concentrated load points are set in the target member 110. For example, four concentrated load points $S_1$, $S_2$, $S_3$, and $S_4$ are set in that order from a fixed surface 120 along a reference axis (e.g., an axis parallel to the Y axis and serving as the center of the target member 110 in the X-axis direction and the Z-axis direction) used in a surface mount technology (SMT) analysis. Alternatively, the concentrated load points may be disposed outside the reference axis. Moreover, the concentrated load points are not limited to the four concentrated load points $S_1$, $S_2$, $S_3$, and $S_4$.

Assuming that the concentrated load points $S_1$, $S_2$, $S_3$, and $S_4$ are not displaced (i.e., are fixed), reactive forces against the distributed loads illustrated in FIG. 2 include concentrated loads (replacement loads $T_{1x}$, $T_{1y}$, and $T_{1z}$, replacement loads $T_{2x}$, $T_{2y}$, and $T_{2z}$, replacement loads $T_{3x}$, $T_{3y}$, and $T_{3z}$, and replacement loads $T_{4x}$, $T_{4y}$, and $T_{4z}$) acting on the concentrated load points $S_1$, $S_2$, $S_3$, and $S_4$, as illustrated in FIG. 3, and moments (replacement moments $M_{1x}$, $M_{1y}$, and $M_{1z}$, replacement moments $M_{2x}$, $M_{2y}$, and $M_{2z}$, replacement moments $M_{3x}$, $M_{3y}$, and $M_{3z}$, and replacement moments $M_{4x}$, $M_{4y}$, and $M_{4z}$) acting on the concentrated load points $S_1$, $S_2$, $S_3$, and $S_4$, as illustrated in FIG. 4.

Each distributed load illustrated in FIG. 2 is replaced with six force components (i.e., the replacement loads and the replacement moments mentioned above) acting on the corresponding one of the concentrated load points $S_1$, $S_2$, $S_3$, and $S_4$.

Figure 5:
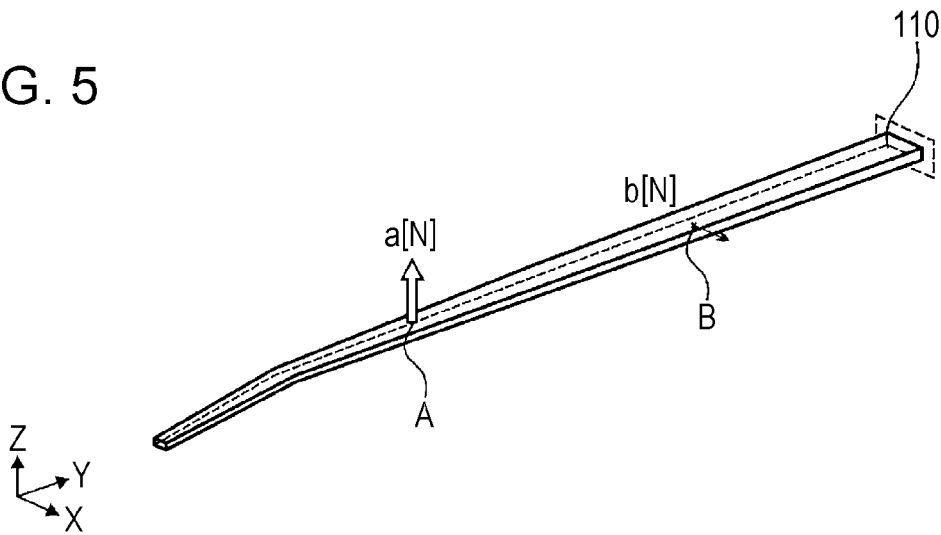
FIG. 5 is a first diagram illustrating an example of an external load and an internal load.

FIG. 5 is a first diagram illustrating an example of an external load and an internal load. As illustrated in FIG. 5, it is assumed that, when a Z-axis component of the external load acting on a site A of the target member 110 is a [N], an X-axis component of the internal load acting on a site B is b [N].

Figure 6:
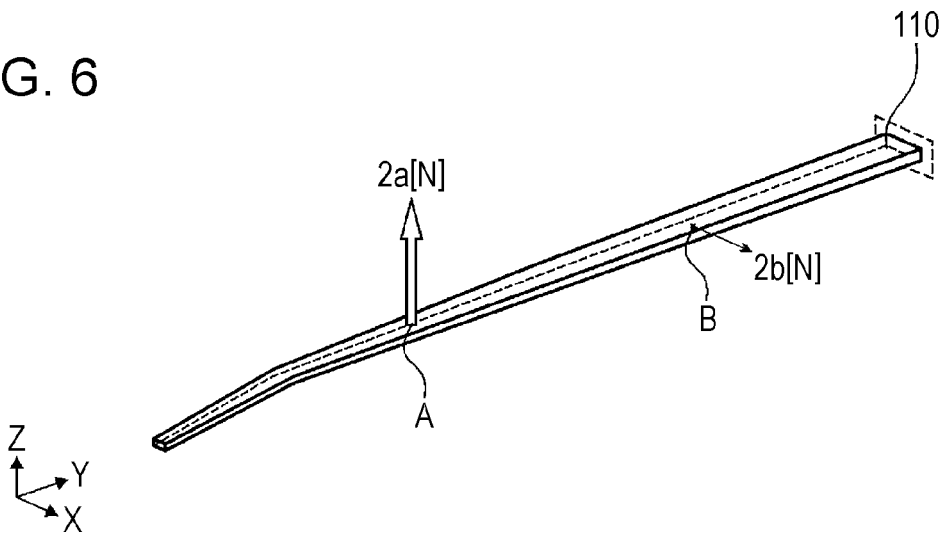
FIG. 6 is a second diagram illustrating an example of an external load and an internal load.

FIG. 6 is a second diagram illustrating an example of an external load and an internal load. As illustrated in FIG. 6, when the Z-axis component of the external load acting on the site A of the target member 110 is 2a [N], the X-axis component of the internal load acting on the site B is 2b [N]. Accordingly, if the sites A and B as targets are the same, the ratio between the external load and the internal load is the same.

Figure 7:
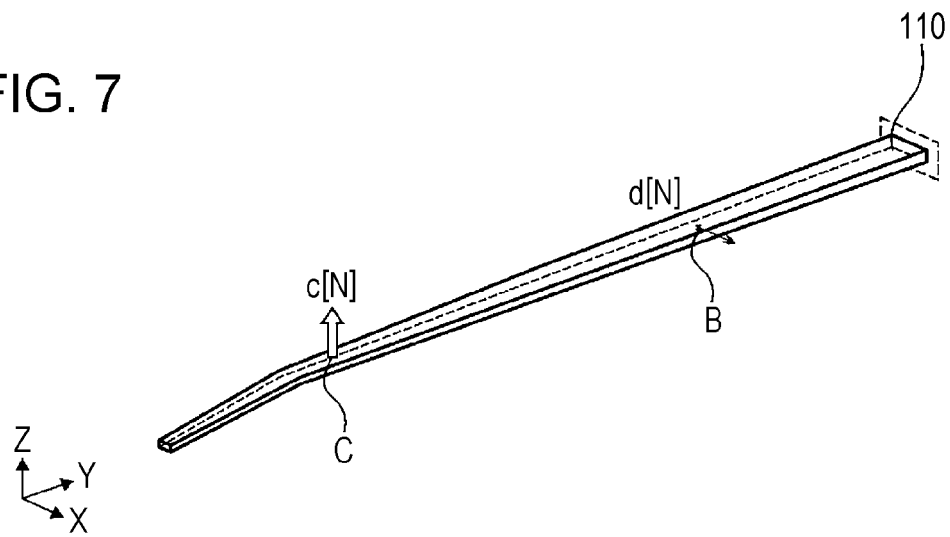
FIG. 7 is a third diagram illustrating an example of an external load and an internal load.

FIG. 7 is a third diagram illustrating an example of an external load and an internal load. As illustrated in FIG. 7, it is assumed that, when the Z-axis component of the external load acting on a site C of the target member 110 is c [N], the X-axis component of the internal load acting on the site B is d [N].

Figure 8:
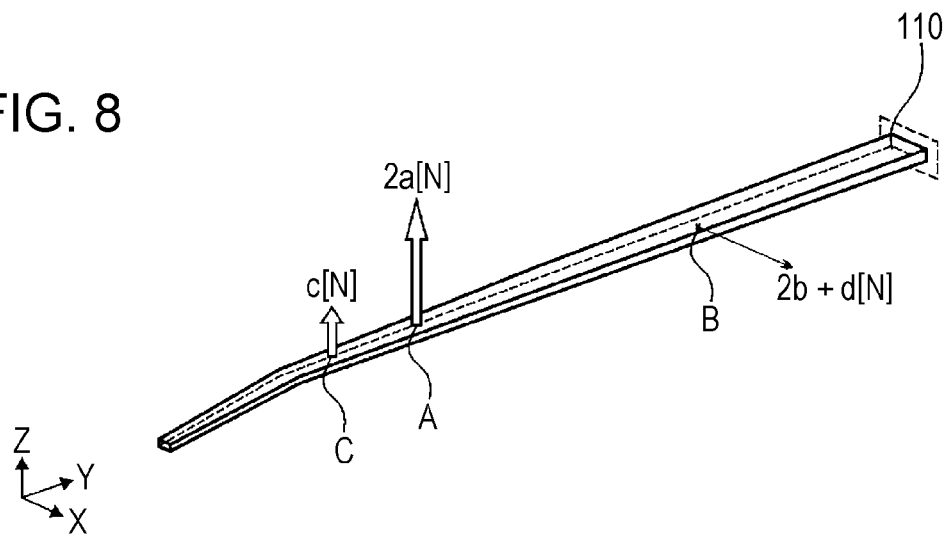
FIG. 8 is a fourth diagram illustrating an example of an external load and an internal load.

FIG. 8 is a fourth diagram illustrating an example of an external load and an internal load. As illustrated in FIG. 8, it is assumed that, when the Z-axis component of the external load acting on the site A of the target member 110 is 2a [N], the Z-axis component of the external load acting on the site C of the target member 110 is c [N]. In this case, the X-axis component of the internal load acting on the site B is 2b+d [N]. Accordingly, when external loads act on the plurality of sites A and C, the site B receives the sum of the internal load occurring at the site B due to the external load acting on the site A and the internal load occurring at the site B due to the external load acting on the site C.

The above description relates to a case where the external load is the Z-axis component and the internal load is an axial internal load (compression and tension) of the X-axis component. Alternatively, the above-described properties may also be applied to a case where the external load relates to each of the X-axis, Y-axis, and Z-axis components and the internal load relates to an axial internal load of any one of the X-axis, Y-axis, and Z-axis components. As another alternative, the above-described properties may also be applied to a case where the external load relates to each of the X-axis, Y-axis, and Z-axis components and the internal load relates to a shear internal load in any one of XY, YZ, and ZX planes.

By utilizing the above-described properties, the internal load acting on any target point of the target member 110 can be expressed with a numerical expression. Numerical expression 1 indicated below is used for deriving an axial internal load Nx acting in the X-axis direction on the target point of the target member 110.

$$Nx = \sum_{i=1}^{N} NxaiTx \times Tix + \sum_{i=1}^{n} NxaiTy \times Tiy + \qquad \text{(Numerical expression 1)}$$

$$\sum_{i=1}^{n} NxaiTz \times Tiz + \sum_{i=1}^{n} MxaiMx \times Mix +$$

$$\sum_{i=1}^{n} MxaiMy \times Miy + \sum_{i=1}^{n} MxaiMz \times Miz$$

Numerical expression 2 indicated below is used for deriving a shear internal load Nxy acting in the XY plane on the target point of the target member 110.

$$Nxy = \sum_{i=1}^{n} NxyaiTx \times Tix + \sum_{i=1}^{n} NxyaiTy \times Tiy + \qquad \text{(Numerical expression 2)}$$

$$\sum_{i=1}^{n} NxyaiTz \times Tiz + \sum_{i=1}^{n} MxyaiMx \times Mix +$$

$$\sum_{i=1}^{n} MxyaiMy \times Miy + \sum_{i=1}^{n} MxyaiMz \times Miz$$

In numerical expressions 1 and 2, a suffix i corresponds to a suffix of any one of the concentrated load points $S_1$, $S_2$, $S_3$, and $S_4$. For example, n may be a value of any one of 1 to 4.

In numerical expression 1, a coefficient NxaiTx denotes an axial internal load acting in the X-axis direction on the target point when an external load (i.e., a unit load) of 1 [N] acts in the X-axis direction on the concentrated load point $S_i$ and no other external load (moment) acts thereon. The coefficient NxaiTx is multiplied by a replacement load Tix actually acting in the X-axis direction on the concentrated load point $S_1$. Consequently, an axial internal load acting in the X-axis direction on the target point due to the replacement load Tix is derived in accordance with the properties described above with reference to FIG. 5 and FIG. 6.

Likewise, in numerical expression 1, a coefficient NxaiTy denotes an axial internal load acting in the X-axis direction on the target point when an external load of 1 [N] acts in the Y-axis direction on the concentrated load point Si and no other external load (moment) acts thereon. A coefficient NxaiTz denotes an axial internal load acting in the X-axis direction on the target point when an external load of 1 [N] acts in the Z-axis direction on the concentrated load point $S_i$ and no other external load (moment) acts thereon.

Figure 9:
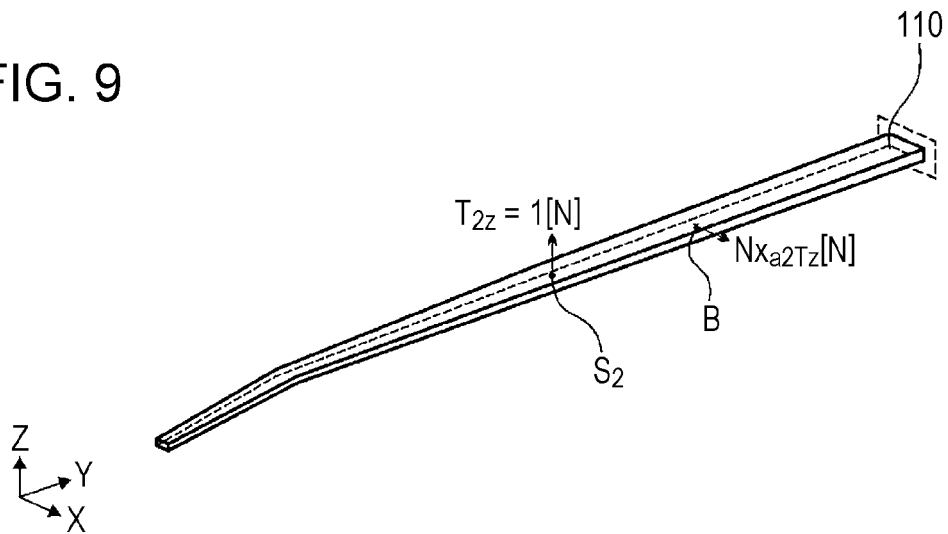
FIG. 9 is a diagram for explaining a coefficient in numerical expression 1.

FIG. 9 is a diagram for explaining the coefficient NxaiTz in numerical expression 1. As illustrated in FIG. 9, for example, a coefficient $Nxa_2Tz$ denotes an axial internal load acting in the X-axis direction on a target point (i.e., the site B) when an external load (i.e., a unit load) of $T_2z=1$ [N] acts on the concentrated load point $S_2$.

In numerical expression 1, a coefficient NxaiMx denotes an axial internal load acting in the X-axis direction on the target point when a moment (i.e., a unit moment) of 1 [N·m] acts around the X axis on the concentrated load point $S_i$ and no other external load (moment) acts thereon. A coefficient NxaiMy denotes an axial internal load acting in the X-axis direction on the target point when a moment of 1 [N·m] acts around the Y axis on the concentrated load point $S_i$ and no other external load (moment) acts thereon. A coefficient NxaiMz denotes an axial internal load acting in the X-axis direction on the target point when a moment of 1 [N·m] acts around the Z axis on the concentrated load point Si and no other external load (moment) acts thereon.

An axial internal load Nx acting in the X-axis direction on the target point is derived as a sum of the terms in numerical expression 1 in accordance with the properties described above with reference to FIG. 6, FIG. 7, and FIG. 8.

In numerical expression 2, a coefficient NxyaiTx denotes a shear internal load acting in the XY plane on the target point when an external load (i.e., a unit load) of 1 [N] acts in the X-axis direction on the concentrated load point $S_i$ and no other external load (moment) acts thereon. The coefficient NxyaiTx is multiplied by a replacement load Tix actually acting in the X-axis direction on the concentrated load point $S_i$. Consequently, a shear internal load acting in the XY plane on the target point due to the replacement load Tix is derived in accordance with the properties described above with reference to FIG. 5 and FIG. 6.

A coefficient NxyaiTy denotes a shear internal load acting in the XY plane on the target point when an external load of 1 [N] acts in the Y-axis direction on the concentrated load point $S_i$ and no other external load (moment) acts thereon. A coefficient NxyaiTz denotes a shear internal load acting in the XY plane on the target point when an external load of 1 [N] acts on the concentrated load point $S_i$ in the X-axis direction and no other external load (moment) acts thereon.

A coefficient NxyaiMx denotes a shear internal load acting in the XY plane on the target point when a moment (i.e., a unit moment) of 1 [N·m] acts around the X axis on the concentrated load point $S_i$ and no other external load (moment) acts thereon. A coefficient NxyaiMy denotes a shear internal load acting in the XY plane on the target point when a moment (i.e., a unit moment) of 1 [N·m] acts around the Y axis on the concentrated load point $S_i$ and no other external load (moment) acts thereon. A coefficient NxyaiMz denotes a shear internal load acting in the XY plane on the target point when a moment of 1 [N·m] acts around the Z axis on the concentrated load point $S_i$ and no other external load (moment) acts thereon.

A shear internal load Nxy acting in the XY plane on the target point is derived as a sum of the terms in numerical expression 2 in accordance with the properties described above with reference to FIG. 6, FIG. 7, and FIG. 8.

The axial internal load Nx in the X-axis direction and the shear internal load Nxy in the XY plane have been described above. An axial internal load Ny in the Y-axis direction, a shear internal load Nyz in the YZ plane, an axial internal load Nz in the Z-axis direction, and a shear internal load Nzx in the ZX plane can also be derived by using numerical expressions similar to those for the axial internal load Nx in the X-axis direction and the shear internal load Nxy in the XY plane.

The aircraft 100 uses a calculation expression for deriving an axial internal load, such as numerical expression 1, and a calculation expression for deriving a shear internal load, such as numerical expression 2, so as to reduce the calculation load. A processing mechanism that uses numerical expressions 1 and 2 will be described in detail below.

Figure 10:
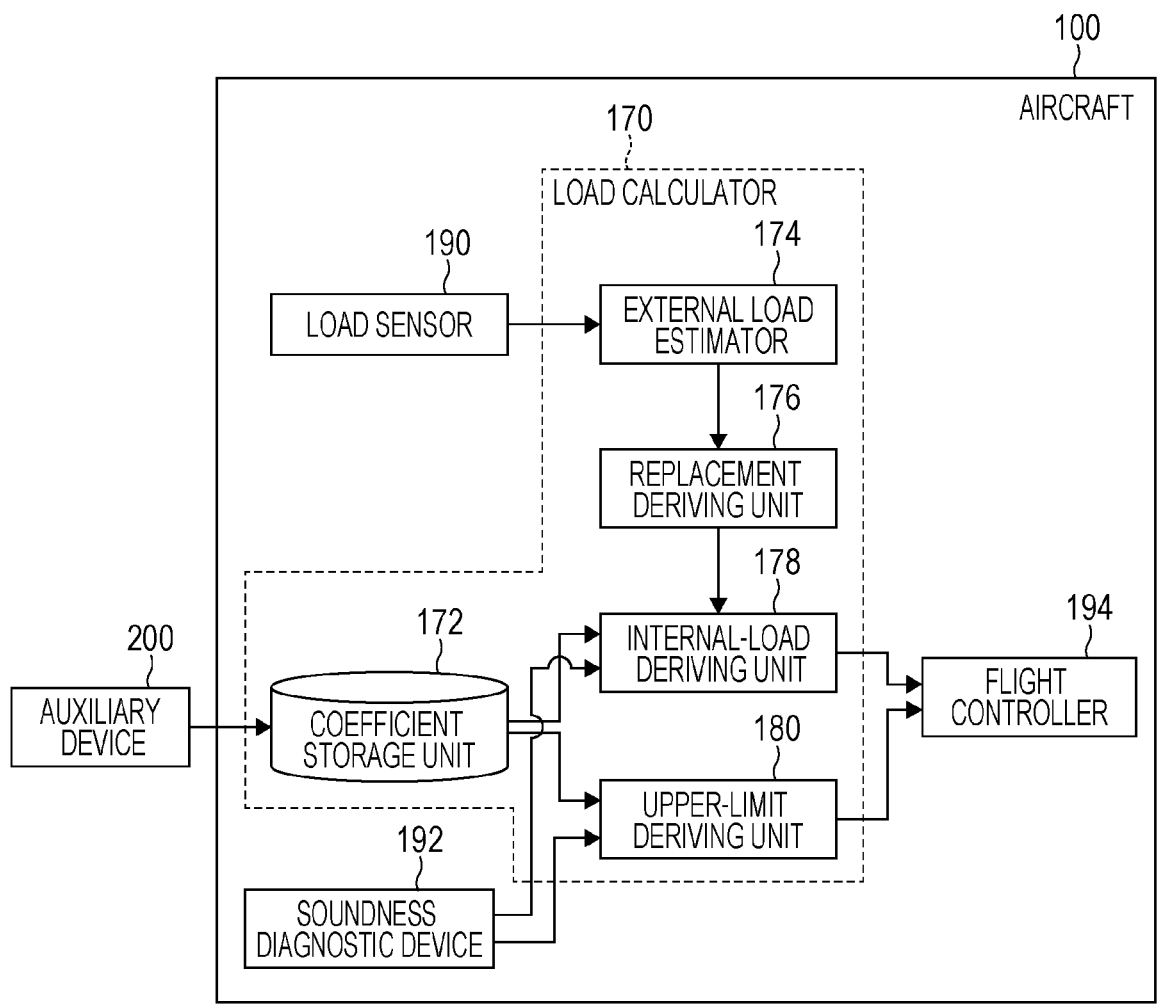
FIG. 10 is a functional block diagram of the aircraft and an auxiliary device.

FIG. 10 is a functional block diagram illustrating the aircraft 100 and an auxiliary device 200. As illustrated in FIG. 10, the aircraft 100 includes a load calculator 170, a load sensor 190, a soundness diagnostic device 192, and a flight controller 194. Although the following description relates to a case where the load calculator 170 is installed in the aircraft 100, the load calculator 170 may alternatively be used in an object other than the aircraft 100.

The load calculator 170 includes a coefficient storage unit 172, an external load estimator 174, a replacement deriving unit 176, an internal-load deriving unit 178, and an upper-limit deriving unit 180. Although the following description relates to a case where the auxiliary device 200 is provided separately from the load calculator 170, the auxiliary device 200 may alternatively be included in the load calculator 170. As another alternative, the auxiliary device 200 may be installed in the aircraft 100.

As preprocessing for performing a load analysis based on the finite element method, the auxiliary device 200 divides model data of the target member 110 into a plurality of cells. The auxiliary device 200 sets the concentrated load points $S_1$, $S_2$, $S_3$, and $S_4$ with respect to the model data of the target member 110. When a unit load acts on each of the concentrated load points $S_1$, $S_2$, $S_3$, and $S_4$ in an axial direction corresponding to one of the three orthogonal axes (i.e., the X axis, the Y axis, and the Z axis), the auxiliary device 200 performs a unit load analysis involving deriving an internal load acting on a target point of the target member 110. The target point is any one of the plurality of cells. The auxiliary device 200 performs the unit load analysis on all of the cells.

The auxiliary device 200 sets the derived internal load as a first coefficient associated with the concentrated load points $S_1$, $S_2$, $S_3$, and $S_4$ and the target point. The first coefficient includes coefficients NxaiTx, NxaiTy, NxaiTz, NxyaiTx, NxyaiTy, and NxyaiTz of numerical expressions 1 and 2 related to the axial internal load Nx in the X-axis direction and the shear internal load Nxy in the XY plane.

Furthermore, the first coefficient also includes coefficients NyaiTx, NyaiTy, NyaiTz, NyzaiTx, NyzaiTy, and NyzaiTz and coefficients NzaiTx, NzaiTy, NzaiTz, NzxaiTx, NzxaiTy, and NzxaiTz that respectively correspond to the coefficients NxaiTx, NxaiTy, NxaiTz, NxyaiTx, NxyaiTy, and NxyaiTz in numerical expressions corresponding to numerical expressions 1 and 2 and related to the axial internal load Ny in the Y-axis direction, the shear internal load Nyz in the YZ plane, the axial internal load Nz in the Z-axis direction, and the shear internal load Nzx in the ZX plane.

When a unit moment acts on each of the concentrated load points $S_1$, $S_2$, $S_3$, and $S_4$ in the target member 110 around one of the three orthogonal axes (i.e., the X axis, the Y axis, and the Z axis), the auxiliary device 200 performs a unit moment analysis involving deriving an internal load acting on the target point. The auxiliary device 200 performs the unit moment analysis on all of the cells.

The auxiliary device 200 sets the derived internal load as a second coefficient associated with the concentrated load points $S_1$, $S_2$, $S_3$, and $S_4$ and the target point. The second coefficient includes coefficients NxaiMx, NxaiMy, NxaiMz, NxyaiMx, NxyaiMy, and NxyaiMz of numerical expressions 1 and 2 related to the axial internal load Nx in the X-axis direction and the shear internal load Nxy in the XY plane.

Furthermore, the second coefficient also includes coefficients NyaiMx, NyaiMy, NyaiMz, NyzaiMx, NyzaiMy, and NyzaiMz, and coefficients NzaiMx, NzaiMy, NzaiMz, NzxaiMx, NzxaiMy, and NzxaiMz that respectively correspond to the coefficients NxaiMx, NxaiMy, NxaiMz, NxyaiMx, NxyaiMy, and NxyaiMz in numerical expressions corresponding to numerical expressions 1 and 2 and related to the axial internal load Ny in the Y-axis direction, the shear internal load Nyz in the YZ plane, the axial internal load Nz in the Z-axis direction, and the shear internal load Nzx in the ZX plane.

In addition to the case where the model data of the target member 110 is in a normal state, if the model data is in a partially deteriorated or defective state, the auxiliary device 200 similarly derives the first and second coefficients by performing the above-described process. There are various patterns with respect to a deteriorated or defective site and the size thereof. For example, the auxiliary device 200 derives the first and second coefficients with respect to multiple assumable patterns. The auxiliary device 200 reflects deterioration or defectiveness by cutting out a cell in the model data corresponding to the deteriorated or defective site or by reducing the computational rigidity of the cell. Alternatively, the auxiliary device 200 may be configured not to derive the first and second coefficients if the target member 110 has a deteriorated or defective site.

The coefficient storage unit 172 stores therein the first and second coefficients derived by the auxiliary device 200 and associated with the concentrated load points $S_1$, $S_2$, $S_3$, and $S_4$ and the target point. For example, the coefficient storage unit 172 stores therein either one of an axial internal load along any of the X, Y, and Z axes and a shear internal load in any of the XY, YZ, and ZX planes acting on any cell of the target member 110 in accordance with either one of a unit load acting in any axial direction among the X-axis, Y-axis, and Z-axis directions and a unit moment acting around any axis among the X, Y, and Z axes on any one of the concentrated load points $S_1$, $S_2$, $S_3$, and $S_4$.

The external load estimator 174 estimates an external load acting on the target member 110 based on, for example, an output from the load sensor 190 or external conditions, such as the traveling direction of the aircraft 100, the speed of the aircraft 100, the wind direction, and the wind speed. The load sensor 190 is provided, for example, near the target member 110. Alternatively, the external load estimator 174 may estimate the external load based on other input information so long as the external load estimator 174 can estimate the external load.

As described above with reference to FIG. 2, FIG. 3, and FIG. 4, the replacement deriving unit 176 replaces an external load, such as a distributed load, with six force components (i.e., replacement loads and replacement moments) acting on each of the concentrated load points $S_1$, $S_2$, $S_3$, and $S_4$.

When an external load acts on the target member 110, the internal-load deriving unit 178 derives an internal load acting on any target point as the sum of the product of the first coefficient and the replacement load and the product of the second coefficient and the replacement moment. For example, the internal-load deriving unit 178 uses six numerical expressions, such as numerical expressions 1 and 2 indicated above, to derive an internal load at any target point of the target member 110. In this case, the internal-load deriving unit 178 reads, from the coefficient storage unit 172, the first and second coefficients corresponding to the target point and the concentrated load points $S_1$, $S_2$, $S_3$, and $S_4$.

An upper limit value for the internal load is sometimes set for any of the target points of the target member 110. The upper limit value for the internal load is stored in the coefficient storage unit 172. The upper limit value may be provided for each of the target points, or may be provided for one or more target points that are estimated to break relatively easily.

In this case, the upper-limit deriving unit 180 similarly derives an upper limit value for the external loads acting on the concentrated load points $S_1$, $S_2$, $S_3$, and $S_4$ associated with the target point from the upper limit value for the internal load acting on the target point and the first and second coefficients associated with the target point. In detail, the upper-limit deriving unit 180 substitutes the upper limit value for the internal load and the corresponding first and second coefficients into six numerical expressions, such as numerical expressions 1 and 2 indicated above, per single target point, thereby approximately deriving an external load in accordance with a numerical analysis with respect to the derived numerical expression. The derived external load becomes the upper limit value for the external loads acting on the concentrated load points $S_1$, $S_2$, $S_3$, and $S_4$.

The soundness diagnostic device 192 uses, for example, a sensor (e.g., either one of an optical fiber sensor and a distortion sensor) set in the target member 110 to measure a physical quantity as a measurement target, such as distortion in the target member 110, on a full-time basis or in a predetermined cycle. The soundness diagnostic device 192 diagnoses the soundness of the target member 110 from the measurement result. For example, the soundness diagnostic device 192 detects partial deterioration or defectiveness in the target member 110.

When the soundness diagnostic device 192 detects partial deterioration or defectiveness in the target member 110, the internal-load deriving unit 178 and the upper-limit deriving unit 180 reads, from the coefficient storage unit 172, the first and second coefficients derived as a simulation of deterioration or defectiveness having the closest pattern to the detected deterioration or defectiveness.

The flight controller 194 performs flight control involving setting the speed and the flight route to prevent the internal load on the target point from exceeding the set upper limit value (i.e., so as to minimize the load applied to the target member 110). If there is a target point where the internal load derived by the internal-load deriving unit 178 exceeds the upper limit value, the flight controller 194 performs flight control involving suppressing speed or avoiding a sharp turn so as to minimize the load applied to the target point.

If the upper limit value for the external load is derived by the upper-limit deriving unit 180, flight control is performed such that the external load is prevented from exceeding the upper limit value, thereby ultimately preventing the internal load on the target point from exceeding the upper limit value.

As mentioned above, the first and second coefficients are derived in advance by the auxiliary device 200 and are stored in the coefficient storage unit 172. Therefore, when deriving the load (i.e., either one of the upper limit value for the external load and the internal load), the internal-load deriving unit 178 and the upper-limit deriving unit 180 can reduce the calculation load. Moreover, since the load is calculated quickly by a simple calculation, the calculated load can be quickly reflected on the flight control.

With regard to partial deterioration or defectiveness in the target member 110, first and second coefficients are similarly derived in advance with various reflected patterns. Therefore, when deriving the load (i.e., either one of the upper limit value for the external load and the internal load), the internal-load deriving unit 178 and the upper-limit deriving unit 180 can reduce the calculation load. Moreover, even when deterioration or defectiveness is actually detected, the load is calculated quickly by a simple calculation, so that the calculated load can be quickly reflected on the flight control.

Figure 11:
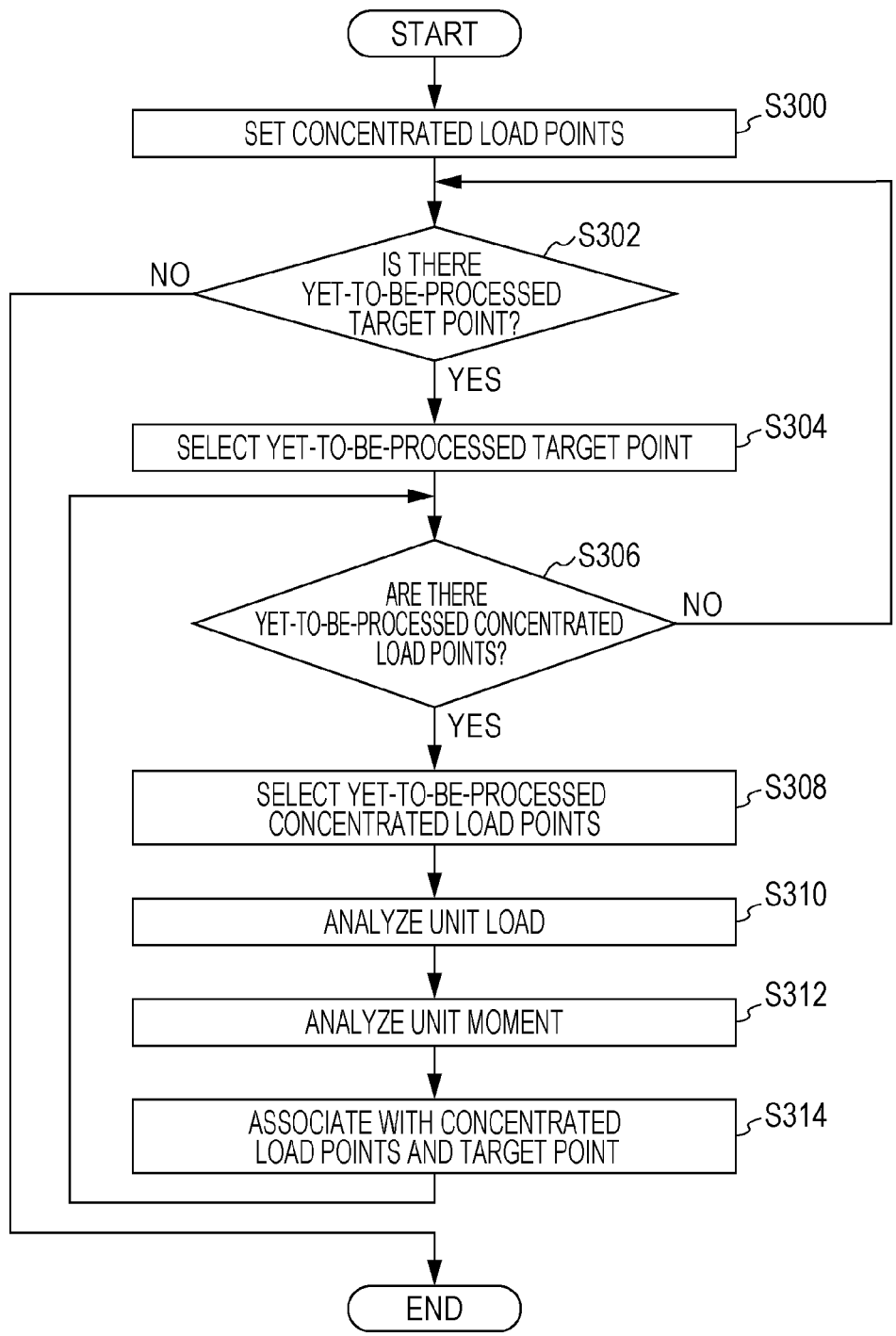
FIG. 11 is a flowchart illustrating the flow of a preliminary process for calculating first and second coefficients.

FIG. 11 is a flowchart illustrating the flow of a preliminary process for calculating the first and second coefficients. The process illustrated in FIG. 11 is preliminarily performed prior to the flight of the aircraft 100. Alternatively, the process illustrated in FIG. 11 may be performed during the flight of the aircraft 100.

As illustrated in FIG. 11, in step S300, the auxiliary device 200 sets concentrated load points $S_1$, $S_2$, $S_3$, and $S_4$ with respect to model data of the target member 110. Then, in step S302, the auxiliary device 200 determines whether there is a yet-to-be-processed target point. If there is no yet-to-be-processed target point (NO in step S302), the preliminary process ends. If there is a yet-to-be-processed target point (YES in step S302), the process proceeds to step S304.

In step S304, the auxiliary device 200 selects the yet-to-be-processed target point. In step S306, the auxiliary device 200 determines whether there are yet-to-be-processed concentrated load points $S_1$, $S_2$, $S_3$, and $S_4$. If there are no yet-to-be-processed concentrated load points $S_1$, $S_2$, $S_3$, and $S_4$ (NO in step S306), the process proceeds to step S302. If there are yet-to-be-processed concentrated load points $S_1$, $S_2$, $S_3$, and $S_4$ (YES in step S306), the process proceeds to step S308.

In step S308, the auxiliary device 200 selects the yet-to-be-processed concentrated load points $S_1$, $S_2$, $S_3$, and $S_4$. Then, in step S310, the auxiliary device 200 performs a unit load analysis on the selected target point and the selected concentrated load points $S_1$, $S_2$, $S_3$, and $S_4$. In step S312, the auxiliary device 200 performs a unit moment analysis on the selected target point and the selected concentrated load points $S_1$, $S_2$, $S_3$, and $S_4$. In step S314, the auxiliary device 200 causes the coefficient storage unit 172 to store the derived unit load and unit moment in association with the concentrated load points $S_1$, $S_2$, $S_3$, and $S_4$ and the target point. The process then proceeds to step S306.

Figure 12:
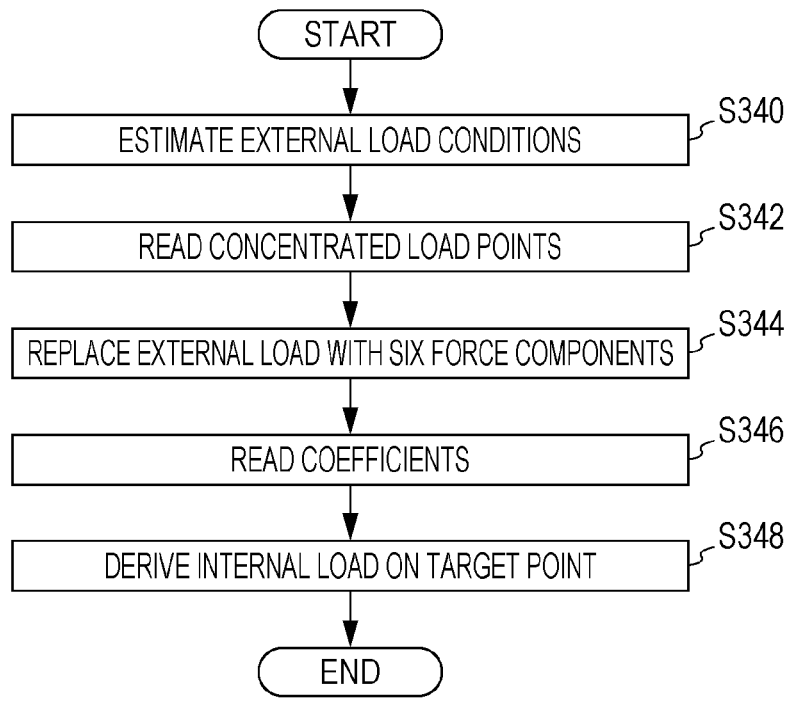
FIG. 12 is a flowchart illustrating the flow of an internal-load deriving process.

FIG. 12 is a flowchart illustrating the flow of an internal-load deriving process. The process illustrated in FIG. 12 is repeated in a predetermined cycle during the flight of the aircraft 100. Moreover, the process illustrated in FIG. 12 may be performed when the soundness diagnostic device 192 updates the result of a soundness diagnosis.

As illustrated in FIG. 12, in step S340, the external load estimator 174 estimates an external load acting on the target member 110. In step S342, the replacement deriving unit 176 reads the coordinates of the concentrated load points $S_1$, $S_2$, $S_3$, and $S_4$ from the coefficient storage unit 172. In step S344, the replacement deriving unit 176 replaces the estimated external load with six force components (i.e., replacement loads and replacement moments) acting on each of the concentrated load points $S_1$, $S_2$, $S_3$, and $S_4$ in the model data of the target member 110.

In step S346, the internal-load deriving unit 178 reads the first and second coefficients corresponding to the target point and the concentrated load points $S_1$, $S_2$, $S_3$, and $S_4$. In step S348, the internal-load deriving unit 178 uses six numerical expressions, such as numerical expressions 1 and 2 indicated above, to derive an internal load acting on the target point in accordance with the read first and second coefficients, the replacement load, and the replacement moment. With regard to the target point in steps S346 and S348, all target points may be selected, or a target point near a site selected in accordance with an operation input may be selected.

Figure 13:
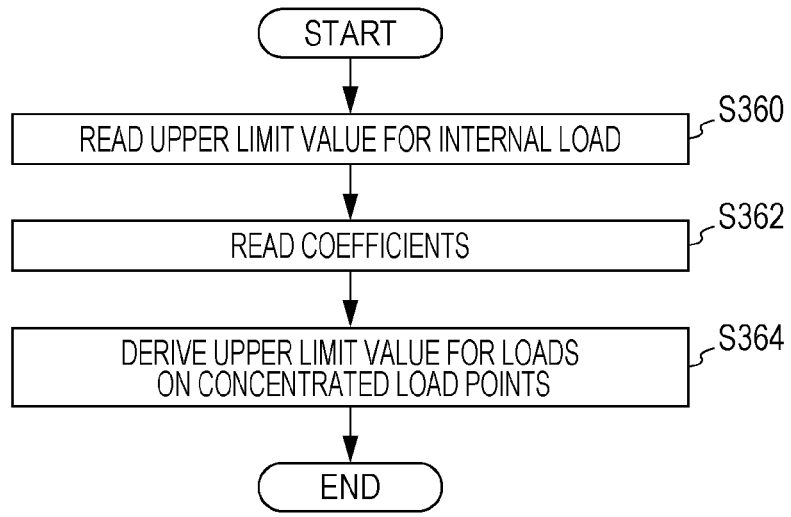
FIG. 13 is a flowchart illustrating the flow of an upper-limit-value deriving process.

FIG. 13 is a flowchart illustrating the flow of an upper-limit-value deriving process. The process illustrated in FIG. 13 is repeated in a predetermined cycle during the flight of the aircraft 100. Moreover, the process illustrated in FIG. 13 may be performed when the soundness diagnostic device 192 updates the result of a soundness diagnosis.

In step S360, the upper-limit deriving unit 180 reads the upper limit value for the internal load from the coefficient storage unit 172. In step S362, the upper-limit deriving unit 180 reads, from the coefficient storage unit 172, the first and second coefficients associated with the target point for which the upper limit value for the internal load is set. In step S364, the upper-limit deriving unit 180 uses six numerical expressions, such as numerical expressions 1 and 2, to derive an upper limit value for an external load acting on each of the concentrated load points $S_1$, $S_2$, $S_3$, and $S_4$ associated with the target point.

Although an embodiment of the present disclosure has been described above with reference to the appended drawings, the present disclosure is not limited to the embodiment. It is obvious to a person skilled in the art that various modifications and alterations are possible within the scope defined in the claims, and it is to be understood that such modifications and alterations belong to the technical scope of the disclosure.

For example, as an alternative to the above-described embodiment where the target member 110 is a main wing of the aircraft 100, the target member 110 may be, for example, a component that receives a distributed load, such as an aerodynamic force, in various conditions.

In the above-described embodiment, the aircraft 100 (i.e., the load calculator 170) is provided with both the internal-load deriving unit 178 and the upper-limit deriving unit 180. Alternatively, the aircraft 100 (i.e., the load calculator 170) may be provided with one of the internal-load deriving unit 178 and the upper-limit deriving unit 180.

Furthermore, the flight controller 194 is provided in the above-described embodiment. In this case, progression of deterioration or defectiveness in the target member 110 can be suppressed by performing flight control. However, the flight controller 194 is not an essential component.

Furthermore, the soundness diagnostic device 192 is provided in the above-described embodiment. In this case, deterioration or defectiveness in the target member 110 can be easily detected without performing a human-based inspection. However, the soundness diagnostic device 192 is not an essential component.

According to an embodiment of the present disclosure, the load for calculating loads can be reduced.

The invention claimed is:

1. A flight control device for an aircraft comprising one or more computers functioned as a load calculator for deriving an internal load in a target member in which three orthogonal axes are defined with respect to the target member and a flight controller, the internal load occurring in response to an external load, the target member including a component part of the aircraft, the load calculator comprising:
an external load estimator configured to estimate the external load acting on the target member including the component part of the aircraft based on an output from a load sensor equipped with the aircraft or on one or more external conditions of the aircraft, wherein the one or more external conditions include at least one selected from a group consisting of a traveling direction of the aircraft, a speed of the aircraft, a wind direction and a wind speed;
a coefficient storage unit configured to store, as a first coefficients and second coefficients, wherein each of the first coefficients denotes an internal load acting on the target point when a unit load in a direction of one of the three orthogonal axes acts on one of concentrated load points in the target member and no other external load and moment acts on the one of the one of the concentrated load points, and wherein each of the second coefficients denotes an internal load acting on the target point when a unit moment around one of the three orthogonal axes acts on the one of the concentrated load points and no other external load and moment acts on the one of the concentrated load points;
a replacement deriving unit configured to derive three replaced loads in directions of the three orthogonal axes acting on the one of the concentrated load points and three replaced moments around the three orthogonal axes acting on the one of the concentrated load points based on the external load acting on the target member; and
an internal-load deriving unit configured to derive the internal load acting on the target point based on a sum of first products and second products, wherein each of the first products is obtained by multiplying corresponding one of the first coefficients to the one of the concentrated load points by one of the three replaced loads respectively, and wherein each of the second products is obtained by multiplying corresponding one of the second coefficients to the one of the concentrated load points by one of the three replaced moments respectively, and the flight controller being configured to perform flight control of the aircraft to prevent the internal load from exceeding a first upper limit value.

2. The flight control device according to claim 1, the flight control device further comprising
an upper-limit deriving unit configured to derive a second upper limit value for a distributed load acting on each one of the concentrated load points associated with the target point from the first upper limit value for the internal load acting on the target point and the corresponding one of the first coefficients and the corresponding one of the second coefficients, wherein
the flight controller is configured to perform the flight control of the aircraft to prevent the distributed load from exceeding the second upper limit value.

3. An aircraft comprising:
the flight control device comprising the load calculator for deriving the internal load in the target member including the component part of the aircraft according to claim 2; and
the component part.

4. The aircraft of claim 3, further comprising a soundness diagnostic device configured to use a sensor set in the target member to measure a physical quantity as a measurement target.

5. The load calculator of claim 2, wherein the first coefficients and the second coefficients are derived in advance by an auxiliary device.

6. The load calculator of claim 5, wherein the first coefficients and the second coefficients are derived in advance by an auxiliary device with consideration of reflected patterns of deterioration or defectiveness of the target member.

7. The aircraft of claim 2, further comprising a soundness diagnostic device configured to use a sensor to detect deterioration or defectiveness in the target member,
wherein the upper-limit deriving unit reads, from the coefficient storage unit, the first coefficients and the second coefficients derived as a simulation of the deterioration or defectiveness having the closest pattern to the detected deterioration or defectiveness as detected by the soundness diagnostic device.

8. An aircraft comprising:
the flight control device comprising the load calculator for deriving the internal load in the target member including the component part of the aircraft according to claim 1; and
the component part.

9. The aircraft of claim 8, further comprising a soundness diagnostic device configured to use a sensor set in the target member to measure a physical quantity as a measurement target.

10. The aircraft of claim 8, further comprising a soundness diagnostic device configured to use a sensor to detect deterioration or defectiveness in the target member,
wherein the internal-load deriving unit reads, from the coefficient storage unit, the first coefficients and the second coefficients derived as a simulation of the deterioration or defectiveness having the closest pattern to the detected deterioration or defectiveness as detected by the soundness diagnostic device.

11. The load calculator of claim 1, wherein the external load includes a z-axis component, and
wherein the internal load includes an axial internal load of an x-axis component.

12. The load calculator of claim 1, wherein the external load relates to each of the three orthogonal axes, and
wherein the internal load relates to a shear internal load of any one of the XY, YZ, ZX planes.

13. The load calculator of claim 1, wherein the first coefficients and the second coefficients are derived in advance by an auxiliary device.

14. The load calculator of claim 13, wherein the first coefficients and the second coefficients are derived in advance by an auxiliary device with consideration of reflected patterns of deterioration or defectiveness of the target member.

* * * * *